United States Patent
Park et al.

(10) Patent No.: US 7,138,812 B2
(45) Date of Patent: Nov. 21, 2006

(54) PROBE CARD

(75) Inventors: Il-Chan Park, Hwaseong-si (KR);
Young-bu Kim, Seongnam-si (KR);
Du-sik Yoo, Hwangseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/341,195

(22) Filed: Jan. 27, 2006

(65) Prior Publication Data
US 2006/0170438 A1    Aug. 3, 2006

(30) Foreign Application Priority Data
Jan. 29, 2005    (KR) .................. 10-2005-0008349

(51) Int. Cl.
*G01R 31/02*    (2006.01)
(52) U.S. Cl. .................. 324/754; 324/761; 324/762
(58) Field of Classification Search .................. None
See application file for complete search history.

(56) References Cited

U.S. PATENT DOCUMENTS

| | | | | |
|---|---|---|---|---|
| 4,523,144 A | * | 6/1985 | Okubo et al. ............... 324/762 |
| 4,719,417 A | * | 1/1988 | Evans ........................ 324/762 |
| 5,382,898 A | * | 1/1995 | Subramanian .............. 324/754 |
| 5,521,518 A | * | 5/1996 | Higgins ...................... 324/754 |
| 6,046,599 A | * | 4/2000 | Long et al. ................. 324/762 |
| 6,472,890 B1 | * | 10/2002 | Khoury et al. ............. 324/754 |
| 6,515,358 B1 | * | 2/2003 | Dass et al. ................. 257/684 |
| 6,535,003 B1 | * | 3/2003 | Aldaz et al. ................ 324/754 |

FOREIGN PATENT DOCUMENTS

| | | |
|---|---|---|
| JP | 02-050452 | 2/1990 |
| JP | 05-041416 | 2/1993 |
| JP | 05-113451 | 5/1993 |
| JP | 11-248748 | 9/1999 |
| JP | 2001-153885 | 6/2001 |
| KR | 10-1996-0005096 | 4/1996 |

* cited by examiner

*Primary Examiner*—Ernest Karlsen
*Assistant Examiner*—Richard Isla-Rodas
(74) *Attorney, Agent, or Firm*—Mills & Onello LLP

(57) ABSTRACT

Provided is a probe card including: a printed circuit board comprising a ground electrode; at least one dielectric disposed below the ground electrode; and a plurality of needles, each of which comprises: a first end portion contacting a wafer pad of a semiconductor device, a second end portion electrically connected to the printed circuit board, and the remaining portion excepting the first and second end portions surrounded by the at least one dielectric. A metal plate is disposed below the at least one dielectric; and a connecting pin electrically connects the metal plate to the ground electrode and fixes the at least one dielectric and the metal plate to the printed circuit board.

20 Claims, 10 Drawing Sheets

PROBE CARD

CROSS-REFERENCE TO RELATED PATENT APPLICATIONS

This application claims the benefit of Korean Patent Application No. 10-2005-0008349, filed on Jan. 29, 2005, in the Korean Intellectual Property Office, the contents of which are incorporated herein in their entirety by reference.

BACKGROUND OF THE INVENTION

1. Field of the Invention

The present invention relates to a probe card used to detect the electrical characteristics and defects of a semiconductor device, such as an integrated circuit formed on a semiconductor wafer, and more particularly, to a probe card for testing high-frequency digital signals or analog signals.

2. Description of the Related Art

Typically, the electrical characteristics of semiconductor devices such as an integrated circuit are tested when semiconductor devices are formed on a wafer. That is, if a semiconductor integrated circuit is found to have detects after being packaged, the packaging process is wasted. Thus, the electrical characteristics of the semiconductor integrated circuit are tested when the semiconductor integrated circuit is disposed on a wafer before chips are cut. In order to test electrical characteristics, first, a needle of a probe card contacts an external contact terminal of an integrated circuit such as a wafer pad; an electric signal is input from an electrical characteristics testing apparatus to the integrated circuit through the needle; and then an output wave signal is received by the electrical characteristics testing apparatus from the integrated circuit.

FIG. 1 is a schematic diagram of a conventional cantilever probe card.

Referring to FIG. 1, a needle 20 electrically connected to a printed circuit board (PCB) 10 is fixed by an epoxy ring 30. The needle 20 is composed of tungsten and is electrically connected to a signal line (not shown) formed in the PCB 10 by, for example, soldering. The needle 20 extends 5 mm from the inner circumference of the epoxy ring 30 so that a wafer can be supported by elastic force of the needle 20.

Since signal lines in the PCB 10 can be multi-layered, impedance matching can be realized. Therefore, when signals are transferred at high rates, noise generated by, for example, reflection and crosstalk can be removed. However, it is difficult to obtain impedance matching between the signal lines of the PCB 10 and an end of the needle 20, and thus, electric parasitic inductance occurs. A current signal from the integrated circuit being tested is interrupted by the parasitic inductance of the needle 20 and thus, an increase or decrease of the output of the integrated circuit is delayed. In addition, as a measurement frequency increases, the parasitic inductance further degrades transferring characteristics. The conventional probe card illustrated in FIG. 1 is suitable for a direct current (DC) test with a frequency of less than 100 MHz, but is not suitable for testing an analog device or logic devices with a frequency greater than 500 MHz. That is, the conventional cantilever probe card is not suitable for testing high speed characteristics of an integrated circuit.

However, the parasitic inductance can be decreased by reducing the length of the needle 20, thus decreasing transfer loss. However, the needle 20 must be of at least a standard length or longer. As illustrated in FIG. 1, the needle 20 can be divided into three portions 20a, 20b, and 20c. The portion 20a of the needle 20 contacts a wafer pad. The portion 20b of the needle 20 is surrounded by the epoxy ring 30 to be attached to the PCB 10. The portion of 20c of the needle 20 is connected to the signal line of the PCB 10. In this case, a length L1 of the portion 20a cannot be reduced because elastic force must be maintained, a length L2 of the portion 20b cannot be reduced because the needle 20 must be completely fixed in the epoxy ring 30, and a length L3 of the portion 20c cannot be reduced because adjacent needles 20 can be bridged to each other. Rather, the length of the needle 20 must be increased to test chips on a wafer before cutting them. Therefore, RF devices operating at a range of hundreds of MHz to a few GHz and high speed logic devices cannot be tested before packing, thus decreasing productivity.

Although probe cards not including needles have been developed to test RF devices operating at a range of hundreds of MHz to a few GHz, or high speed logic devices, the manufacturing process is complex, long, and expensive. For example, the manufacturing costs for probe cards not including needles are tens times higher than the manufacturing costs for probe cards including tungsten needles. In addition, the repair of probe cards during mass production requires a long time. Therefore, it is difficult to achieve the development and mass production of a probe card not including needles.

In addition, a portion of the needle can be surrounded by an insulating material and a metallic structure to thus form a coaxial cable so that the inductance of the needle can be decreased. In this case, however, the manufacturing costs are high because holes in which the needle and the insulating material are filled must be made in the metallic structure.

SUMMARY OF THE INVENTION

The present invention provides a probe card used to precisely measure a signal of an integrated circuit operating at a high frequency.

The present invention also provides a method of manufacturing the probe card.

According to an aspect of the present invention, there is provided a probe card including: a printed circuit board comprising a ground electrode; at least one dielectric disposed below the ground electrode; and a plurality of needles, each of which comprises: a first end portion contacting a wafer pad of a semiconductor device, a second end portion electrically connected to the printed circuit board, and a remaining portion excepting the first and second end portions surrounded by the at least one dielectric. A metal plate is disposed below the at least one dielectric; and a connecting pin electrically connects the metal plate to the ground electrode and fixes the at least one dielectric and the metal plate to the printed circuit board.

In one embodiment, the at least one dielectric comprises an upper dielectric layer and a lower dielectric layer and the needles are disposed between the upper dielectric layer and the lower dielectric layer. The upper dielectric layer and the lower dielectric layer can have the same thicknesses. In one embodiment, the probe card further comprises an adhesive filling spaces between the needles interposed between the upper and lower dielectric layers. Spaces formed between the upper and lower dielectric layers and the needles can be filled with the adhesive, and the adhesive can contain epoxy.

In one embodiment, the at least one dielectric is a bulky hexahedron and has through holes through which the needles are passed. The through holes can pass through the center of the at least one dielectric. The through holes can be parallel to the printed circuit board.

In one embodiment, the at least one dielectric is Teflon. In one embodiment, the metal plate is composed of Cu or Al.

In one embodiment, the ground electrode, the at least one dielectric, and the metal plate have the same areas.

In one embodiment, the connecting pins are disposed at corners of the metal plate.

In one embodiment, each of the connecting pins comprises: a bolt passing through the metal plate, the at least one dielectric, and the ground electrode; and a nut into which the bolt is threaded on the printed circuit board.

In one embodiment, each of the connecting pins comprises: a bolt, which is attached to the metal plate and passes through the at least one dielectric and the ground electrode; and a nut into which the bolt is threaded on the printed circuit board.

In one embodiment, the semiconductor device is an RF device and the second end portions of the needles through which the ground and the signal are supplied to the RF device are shorter than other needles.

In one embodiment, the printed circuit board comprises an opening and four ground electrodes extending radially from the opening, and each of the ground electrodes are respectively disposed above the dielectrics and the metal plates.

According to another aspect of the present invention, there is provided a method of forming a probe card, the method including: passing a plurality of needles through an upper dielectric layer and a lower dielectric layer such that first end portions and second end portions of the needles protrude from the upper and lower dielectric layers, and then fixing the needles with an adhesive; placing a metal plate below the lower dielectric layer; arranging the upper dielectric layer such that the upper dielectric layer faces a ground electrode formed in a printed circuit board; fixing the upper and lower dielectric layers and the metal plate to the printed circuit board using connecting pins such that the metal plate is electrically connected to the ground electrode; and bending the first end portion to contact a wafer pad of a semiconductor device and electrically connecting the second end portion to the printed circuit board.

According to yet another aspect of the present invention, there is provided a method of forming a probe card, the method including: passing a plurality of needles through a plurality of through holes formed in a bulky hexahedral dielectric such that first end portions and second end portions of the needles protrude from the dielectric; placing a metal plate below the dielectric; arranging the dielectric such that an upper surface of the dielectric opposite the metal plate faces a ground electrode formed in a printed circuit board; fixing the dielectric and the metal plate to the printed circuit board using connecting pins such that the metal plate is electrically connected to the ground electrode; and bending the first end portion to contact a wafer pad of a semiconductor device and electrically connecting the second end portion to the printed circuit board.

In one embodiment, passing the needles through the through holes comprises: forming the bulky hexahedral dielectric; forming the through holes through the dielectric; and passing the needles through the through holes such that the first end portions and second end portions of the needles protrude from the dielectric.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

According to the present invention, an epoxy ring of a conventional cantilever probe card is substituted by a structure similar to a coaxial cable, thus decreasing transfer loss. That is, a needle is surrounded with a dielectric and a metal plate instead of the epoxy ring so that the inductance of all but an elastic portion of the needle can be minimized. However, the coaxial structure of the present invention is different from a conventional coaxial structure in that the metal plate is electrically connected to a ground electrode of a printed circuit board and the middle portion of the needle is surrounded by the dielectric layer interposed between ground conductances. Accordingly, the impedance of the middle portion of the needle is determined by the thickness and dielectricity of the dielectric. That is, a desired impedance can be obtained by choosing a dielectric material with a predetermined dielectricity and adjusting the thickness of the dielectric material. For example, the impedance of the middle portion of the needle can be matched at 50Ω.

Probe cards according to embodiments of the present invention and methods of manufacturing the same will now be described.

EMBODIMENT 1

Figure 1:
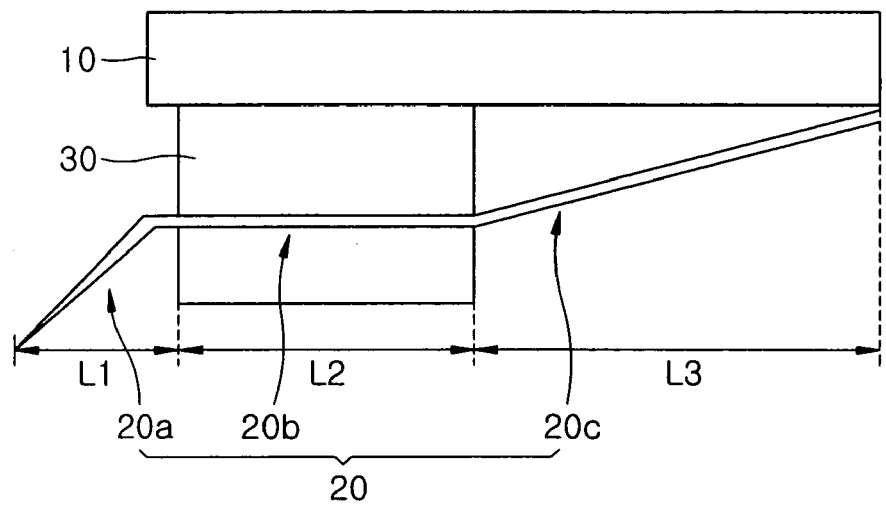
FIG. 1 is a schematic view of a conventional cantilever probe card including a needle, which is electrically connected to a printed circuit board and fixed by an epoxy ring.
Figure 2:
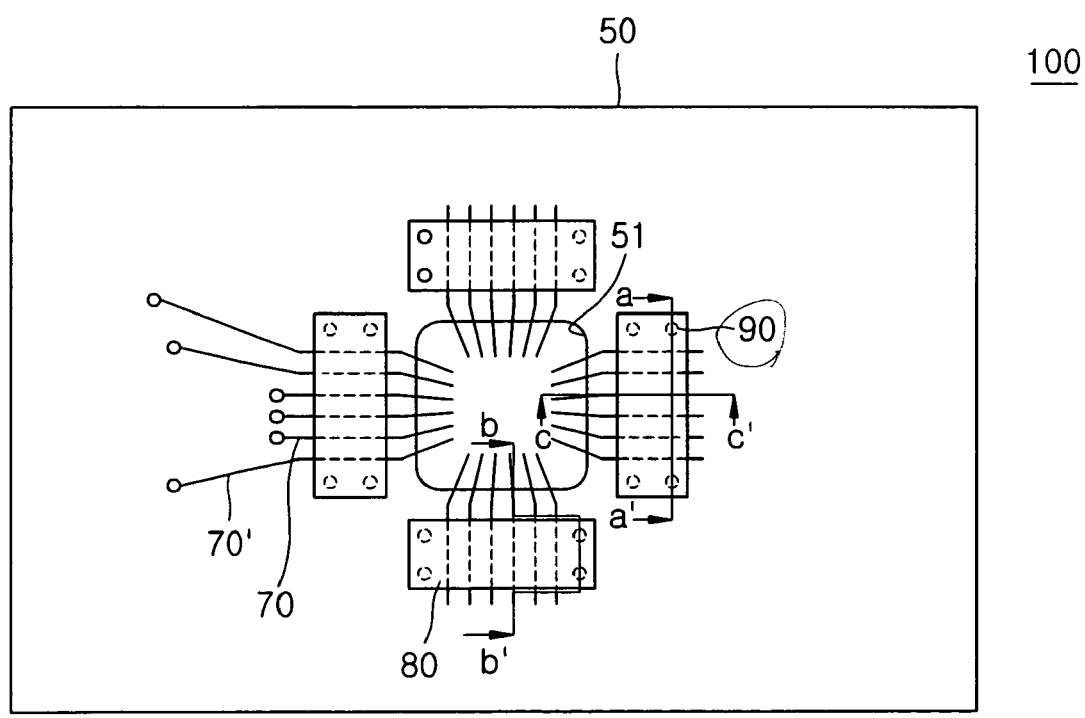
FIG. 2 is a view of a bottom surface of a probe card according to a first embodiment of the present invention.

FIG. 2 is a view of a bottom of a probe card 100 according to a first embodiment of the present invention.

Figure 3A:
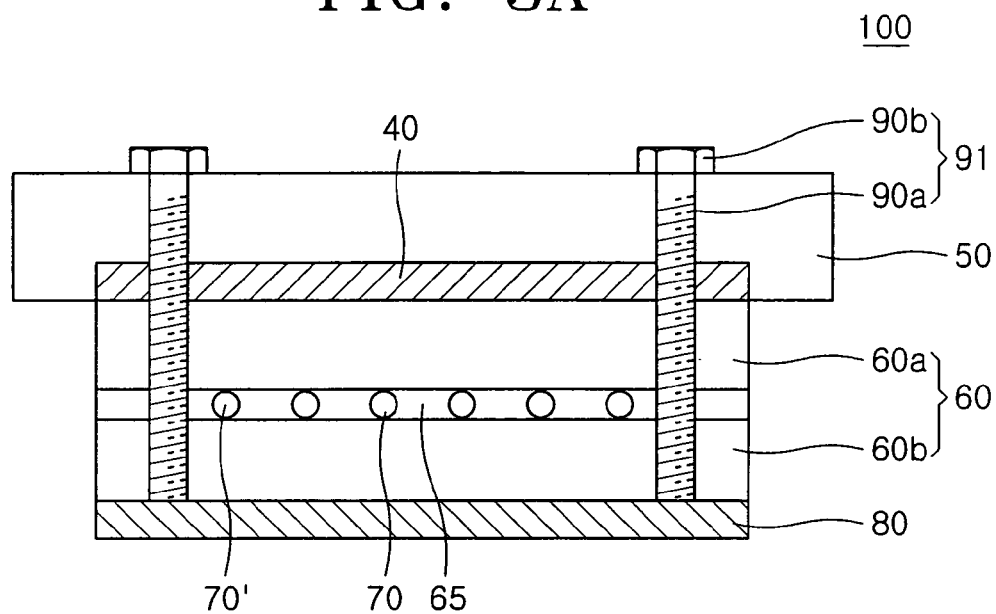
FIG. 3A is a sectional view taken along line a–a' of FIG. 2.
Figure 3B:
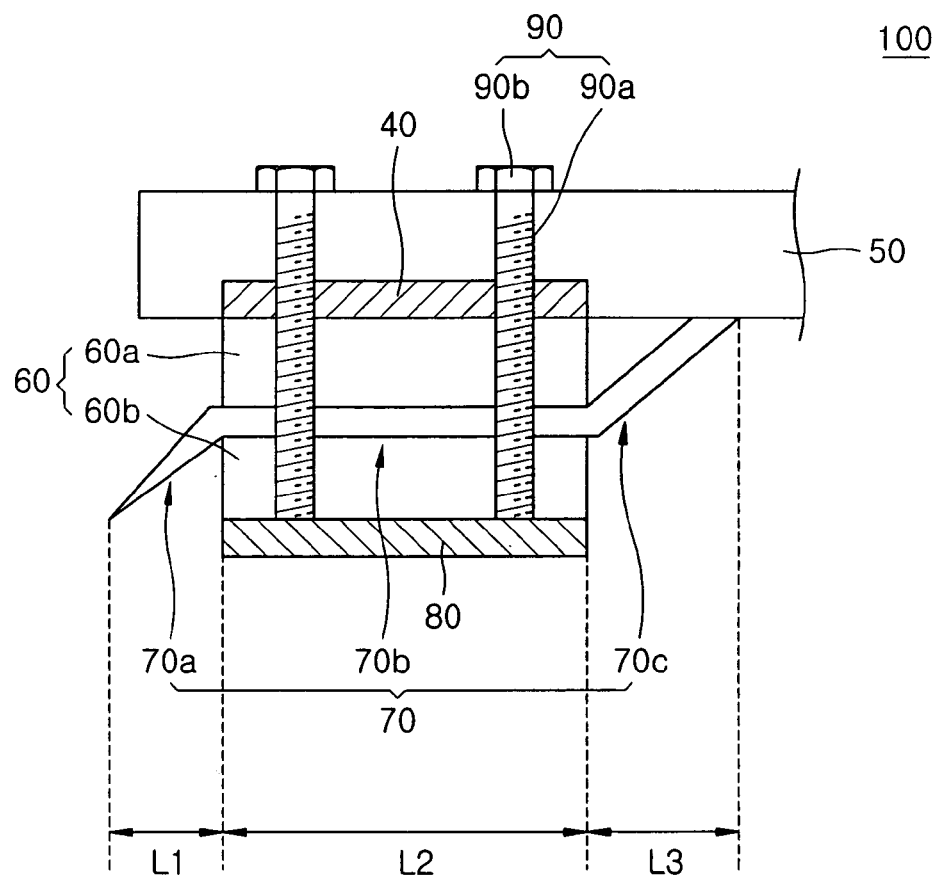
FIG. 3B is a sectional view taken along line b–b' of FIG. 2.
Figure 3C:
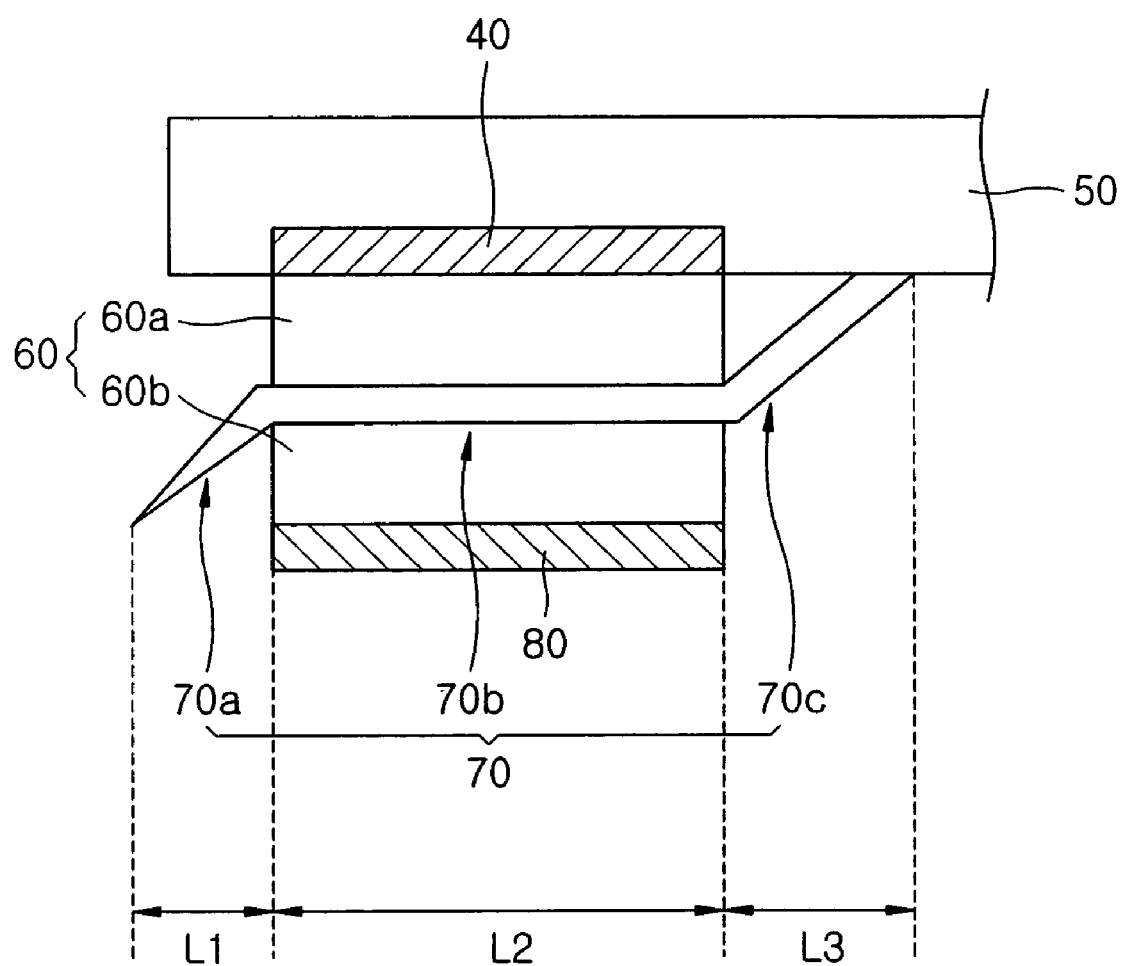
FIG. 3C is a sectional view taken along line c–c' of FIG. 2.

FIG. 3A is a sectional view taken along line a–a' of FIG. 2, FIG. 3B is a sectional view taken along line b–b' of FIG. 2, and FIG. 3C is a sectional view taken along line c–c' of FIG. 2.

Referring to FIG. 2, a printed circuit board (PCB) 50 of the probe card 100 has an opening 51, and four ground electrodes 40 extend radially outside the opening 51. Each of the ground electrodes 40 is disposed above a dielectric 60, needles 70 and 70', and a metal plate 80, and connecting pins 90 pass through the ground electrode 40, the dielectric 60, the needles 70 and 70', and the metal plate 80. The probe card 100 is used to test an RF device, and a ground and a signal are applied to the RF device through the needle 70, and the needle 70' acts as a digital line or a power line.

Referring to FIGS. 3A through 3C, the PCB 50 of the probe card 100 includes the ground electrode 40. The dielectric 60 is formed below the ground electrode 40, and the needles 70 and 70' are surrounded by the dielectric 60. Each of the needles 70 and 70' has a first end portion 70a for contacting a wafer pad (not shown) of a semiconductor device and a second end portion 70c electrically connected to the PCB 50. Portions 70b, that is, residual portions of the needles 70 and 70' not including the first and second end portions 70a and 70c, are surrounded by the dielectric 60. The metal plate 80 is disposed below the dielectric 60 surrounding the needles 70 and 70'. The connecting pins 90 electrically connect the metal plate 80 to the ground electrode 40 and fix the dielectric 60 and the metal plate 80 to the PCB 50.

The dielectric 60 includes dielectric layers 60a and 60b. The dielectric layer 60a is disposed above the needles 70 and 70', and the dielectric layer 60b is disposed below the needles 70 and 70'. The dielectric layers 60a and 60b may have the same thicknesses. An adhesive 65, such as an epoxy-containing adhesive, fills a space between the needles 70 and 70' disposed between dielectric layers 60a and 60b, and a space between the dielectric layers 60a and 60b and the needles 70 and 70'. The adhesive 65 may spread such that the needles 70 and 70' are disposed in the center of the dielectric 60.

When the dielectric 60 is composed of a material with a low dielectric constant, the dielectric 60 can be formed to a small thickness. The material with a low dielectric constant may be, for example, Teflon. The metal plate 80 may be composed of Cu or Al. As illustrated in FIGS. 3A to 3C, the ground electrode 40, the dielectric 60, and the metal plate 80 may have the same areas. However, the dielectric 60 may have a larger area than the ground electrode 40 and the metal plate 80, respectively, or the metal plate 80 may have a larger area than the ground electrode 40 and the dielectric 60, respectively. The connecting pins 90 can be disposed at corners of the metal plate 80. In the present embodiment, the connecting pins 90 are composed of bolts 90a and nuts 90b, and the bolts 90a are attached to the metal plate 80, pass through the dielectric 60 and the ground electrode 40, and are threaded into the nuts 90b on the PCB 50.

In this structure, the portions 70b of the needles 70 and 70' form a structure analogous to a coaxial cable with the dielectric 60, the ground electrode 40, and the metal plate 80. The metal plate 80 is electrically connected to the ground electrode 40 by the connecting pins 90, thus being grounded. Accordingly, the impedance of the portions 70b is determined by the thickness and dielectric constant of the dielectric 60.

In addition, in order to decrease a transfer loss, the lengths of the needles 70 and 70' can be decreased. However, a length L1 of the first end portion 70a contacting the wafer pad (not shown) of the semiconductor device cannot be decreased because the elastic power must be maintained, and a length L2 of the portion 70b cannot be decreased because the portion 70b must be fixed to the PCB 50. Therefore, a length L3 of the second end portion 70c electrically connected to the PCB 50 may be decreased. In this case, as illustrated in FIG. 2, the second end portion 70c of the needle 70 through which a ground and a signal are applied to a RF device may be shorter than the second end portion 70c of the needle 70' so that the formation of a bridge between adjacent needles 70 and 70' can be prevented.

In this structure, inductance of the portions 70b of the needles 70 and 70' can be decreased, and a high speed wave signal generated by a high speed integrated circuit can be transferred to a measuring apparatus without distortion. As a result, an operation test for a high speed integrated circuit can be carried out.

Figure 4:
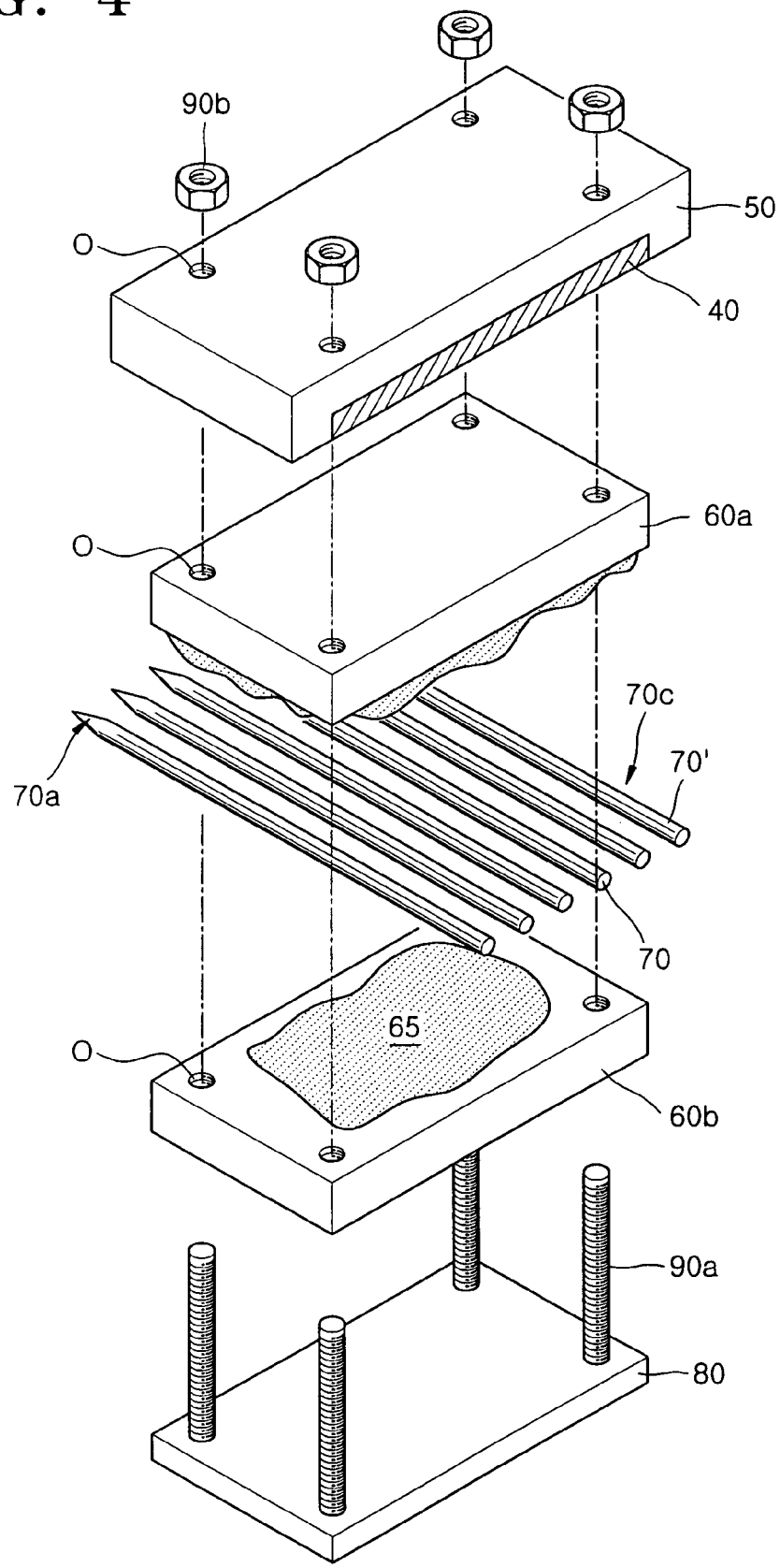
FIG. 4 is an exploded view illustrating a method of manufacturing the probe card according to the first embodiment of the present invention.

FIG. 4 is an exploded view illustrating a method of manufacturing the probe card 100 illustrated in FIG. 2.

Referring to FIG. 4, the needles 70 and 70' are fixed between the dielectric layers 60a and 60b using the adhesive 65 such that the first end portions 70a and second end portions 70c of the needles 70 and 70' protrude from the dielectric layers 60a and 60b. The metal plate 80 is placed below the dielectric layer 60b, which is disposed below the dielectric layer 60a. Then, the first dielectric layer 60a is arranged to face the ground electrode 40 of the PCB 50, and then the dielectric layers 60a and 60b and the metal plate 80 are fixed and electrically connected to the PCB 50 by using the connecting pins 90. In the present embodiment, the connecting pins 90 are composed of the bolts 90a and the nuts 90b. The bolts 90a are attached to the upper surface of the metal plate 80 and threaded into the nut 90b on the PCB 50. Then, the first end portions 70a of the needles 70 and 70' are bent to contact the wafer pad of the semiconductor device and the second end portion 70c of the needles 70 and 70' are electrically connected to the PCB 50. In addition, holes O through which the bolts 90a pass are made in the dielectric layers 60a and 60b and the PCB 50 including the ground electrode 40 so that connections between the bolts 90a and the nuts 90b can be made.

In a conventional method of forming a portion of a needle in a coaxial cable, a hole is formed in a metal structure and then a needle surrounded by an insulating material is passed through the hole. However, in the present embodiment, the dielectric layers 60a and 60b and the metal plate 80 are fixed to the PCB 50 using the connecting pins 90. That is, the method according to the present embodiment is readily accomplished, and if repairs are required, the needle can be easily replaced because the connecting pins 90 can be easily removed.

SECOND EMBODIMENT

Figure 5A:
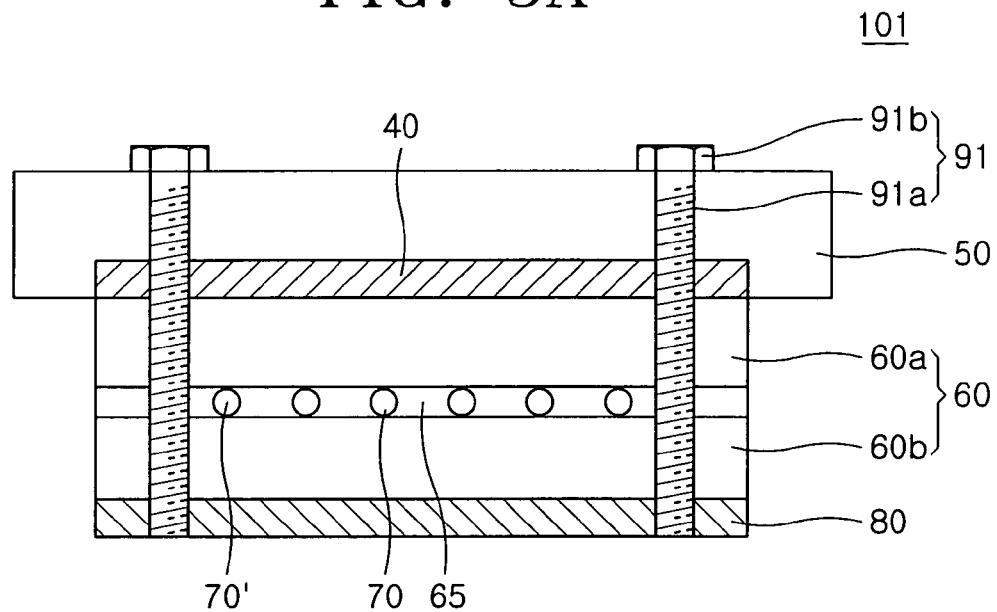
FIG. 5A is a sectional view of the probe card according to a second embodiment of the present invention corresponding to the sectional view taken along line a–a' of FIG. 2.
Figure 5B:
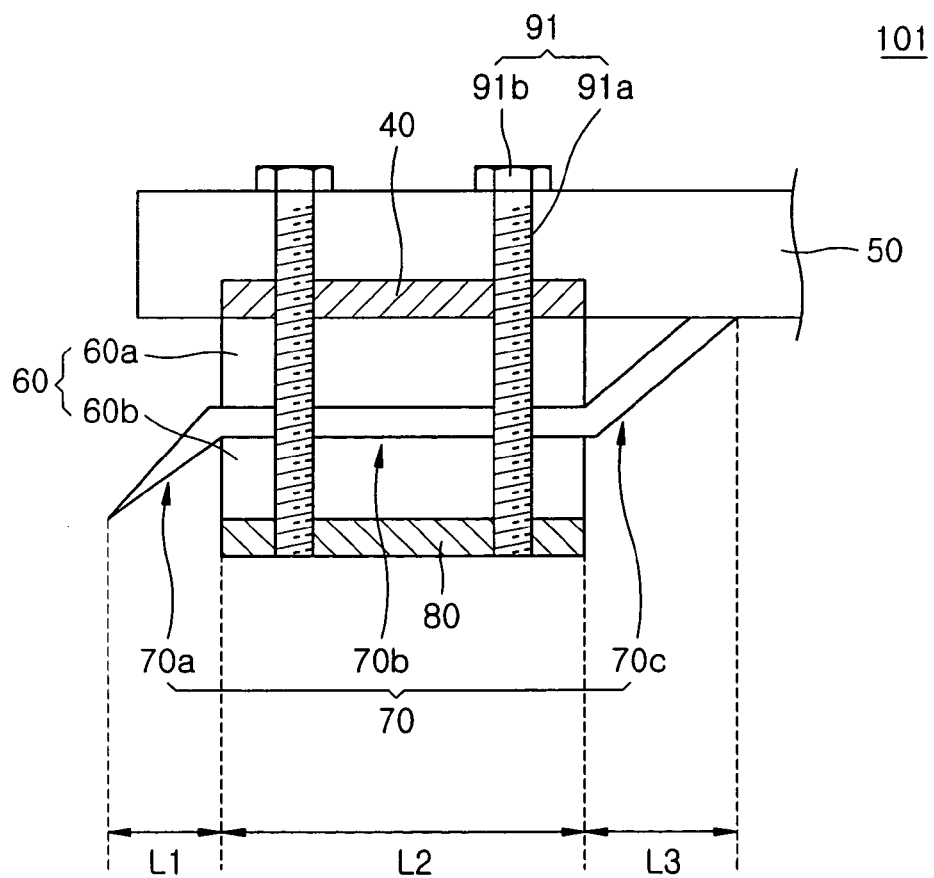
FIG. 5B is a sectional view of a probe card according to the second embodiment of the present invention corresponding to the sectional view taken along line b–b' of FIG. 2.

FIG. 5A is a sectional view of a probe card 101 according to a second embodiment of the present invention corresponding to the sectional view taken along line a–a' of FIG. 2, and FIG. 5B is a sectional view of the probe card 101 corresponding to the sectional view taken along line b–b' of FIG. 2.

The present embodiment is the same as the first embodiment except that, referring to FIGS. 5A and 5B, connecting pins 91 are composed of bolts 91a and nuts 91b, and the bolts 91a pass through a metal plate 80, a dielectric 60, and a ground electrode 40 and are threaded into the nuts 91b on a PCB 50. In this case, the metal plate 80 may have a hole for the bolts 91a.

THIRD EMBODIMENT

Figure 6A:
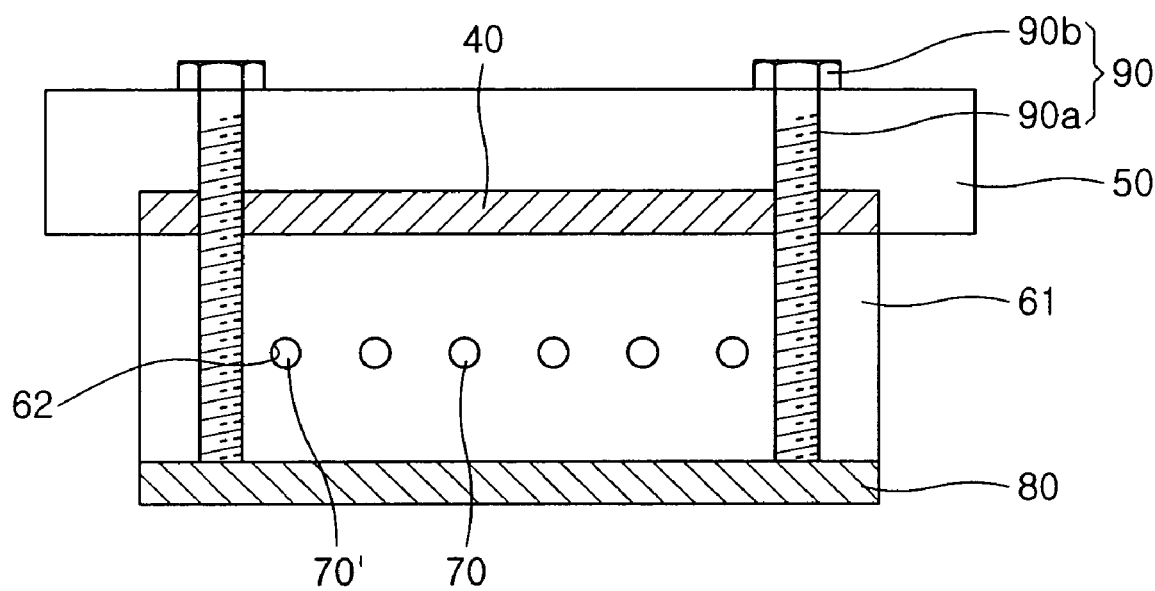
FIG. 6A is a sectional view of a probe card according to a third embodiment of the present invention corresponding to the sectional view taken along line a–a' of FIG. 2.
Figure 6B:
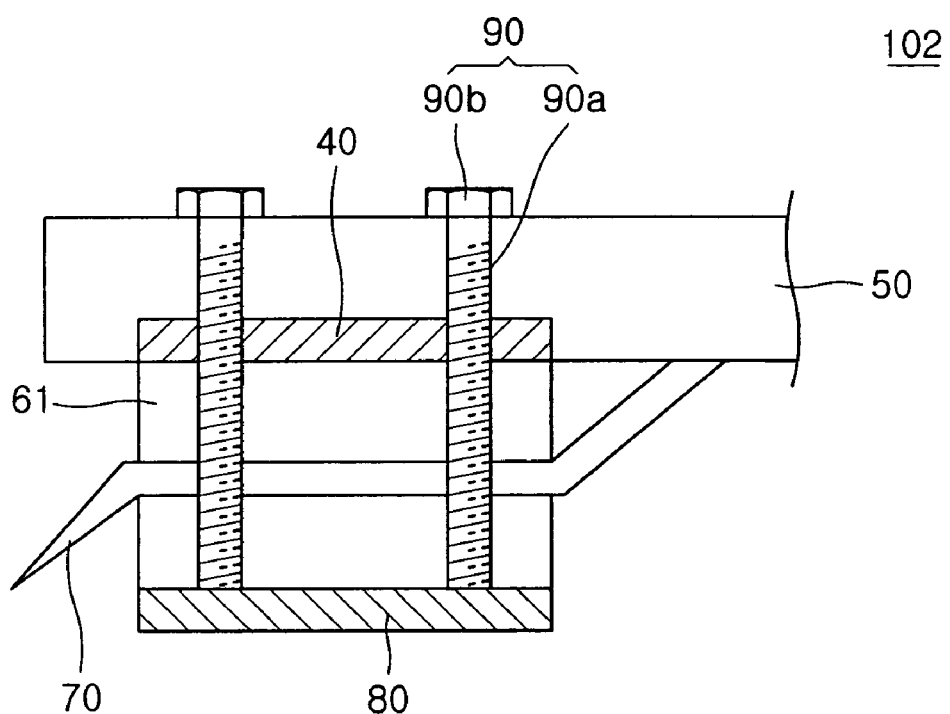
FIG. 6B is a sectional view of the probe card according to the third embodiment of the present invention corresponding to the sectional view taken along line b–b' of FIG. 2.
Figure 6C:
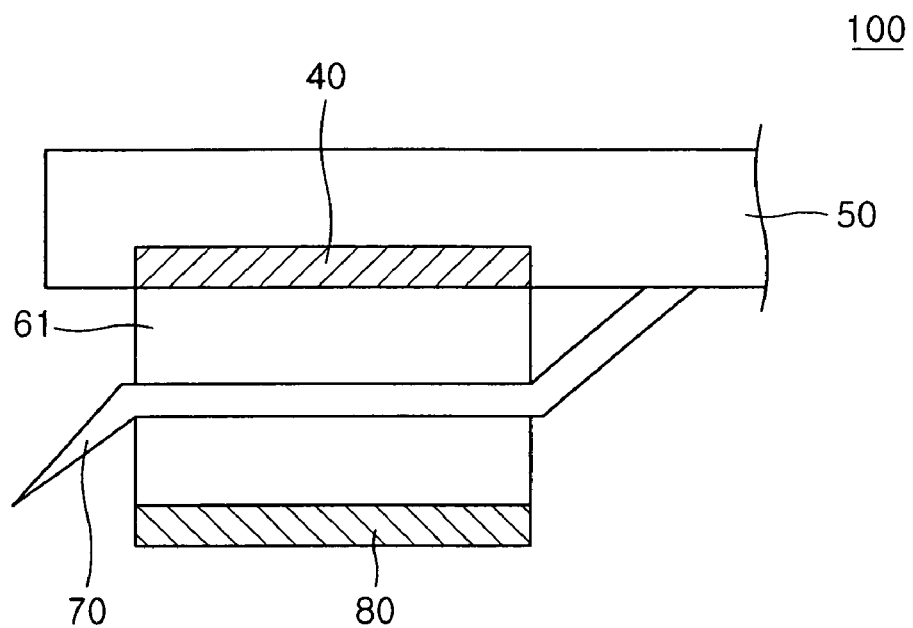
FIG. 6C is a sectional view of the probe card according to the third embodiment of the present invention corresponding to the sectional view taken along line c–c' of FIG. 2.

FIG. 6A is a sectional view of a probe card 102 according to a third embodiment of the present invention corresponding to the sectional view taken along line a–a' of FIG. 2, FIG. 6B is a sectional view of the probe card 102 corresponding to the sectional view taken along line b–b' of FIG. 2, and FIG. 6C is a sectional view of the probe card 102 corresponding to the sectional view taken along line c–c' of FIG. 2.

The present embodiment is the same as the first embodiment, except for the following points.

Referring to FIGS. 6A and 6C, a plurality of needles 70 and 70' are surrounded by a dielectric 61. The dielectric 61 forms a bulky hexahedron, and has through holes 62 through which needles 70 and 70' are passed. The through holes 62 may be formed in the center of the dielectric 61, and parallel to a PCB 50. The dielectric 61 is composed of Teflon, which has a low dielectric constant, so that the dielectric 61 can be formed to a small thickness.

In the present embodiment, the needles 70 and 70' are passed through the through holes 62 of the bulky hexahedral dielectric 61 such that first and second end portions 70a and 70c of the needles 70 and 70' protrude from the dielectric 61. The dielectric 61 and a metal plate 80 may be fixed to the PCB 50 by bolts 90a and nuts 90b in the same manner as in the first embodiment.

A method of passing the needles 70 and 70' through the dielectric 61 will now be described.

Figure 7A:
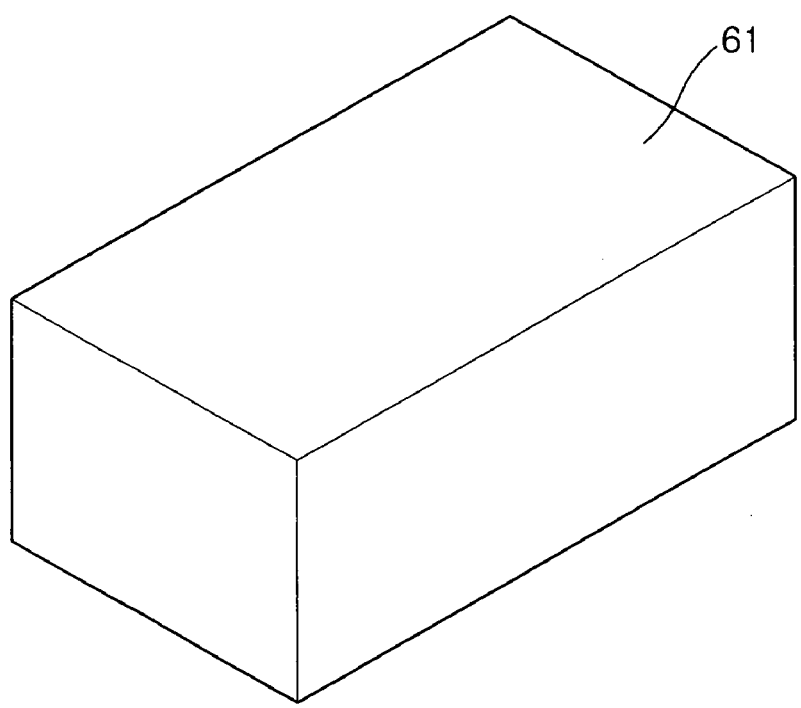
FIGS. 7A to 7C are perspective views illustrating a method of forming the probe card according to the third embodiment of the present invention, in particular, a method of passing needles through a dielectric.
Figure 7B:
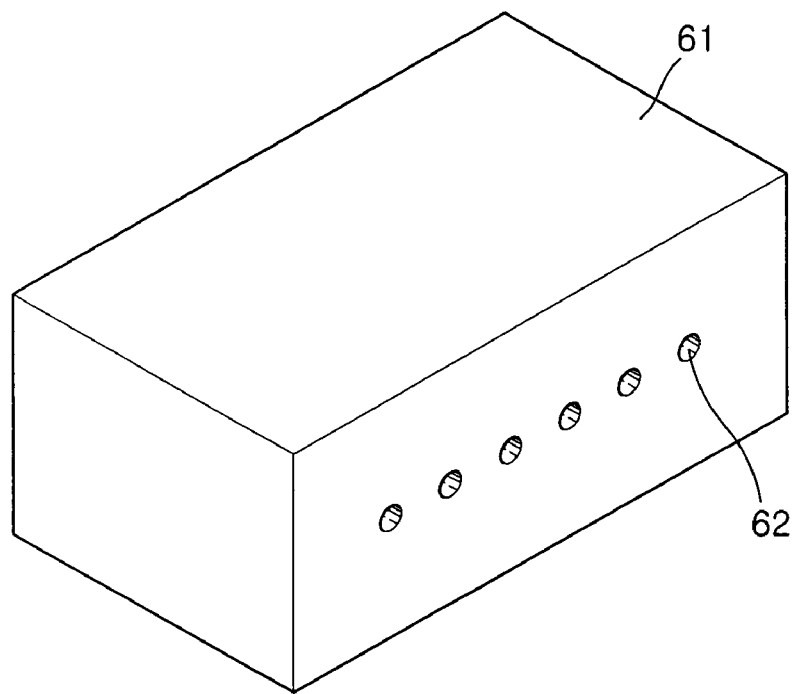
Figure 7C:
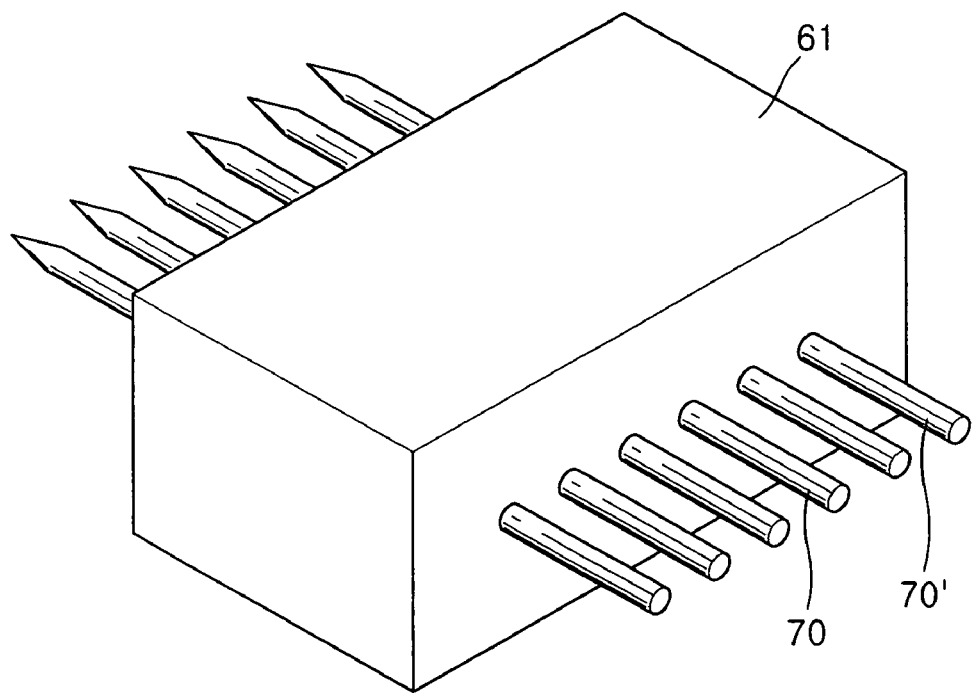

FIGS. 7A to 7C are perspective view illustrating a method of passing the needles 70 and 70' through the dielectric 61.

First, referring to FIG. 7A, the bulky hexahedral dielectric 61 is formed.

Then, referring to FIG. 7B, the through holes 62 are formed through the dielectric 61.

Then, referring to FIG. 7C, the needles 70 and 70' are passed through the through holes 62.

Alternately, the needles 70 and 70' can be arranged in a mold used to form the hexahedral bulky dielectric 61, and then a dielectric material is injected into the mold, hardened, and separated from the mold.

FOURTH EMBODIMENT

Figure 8A:
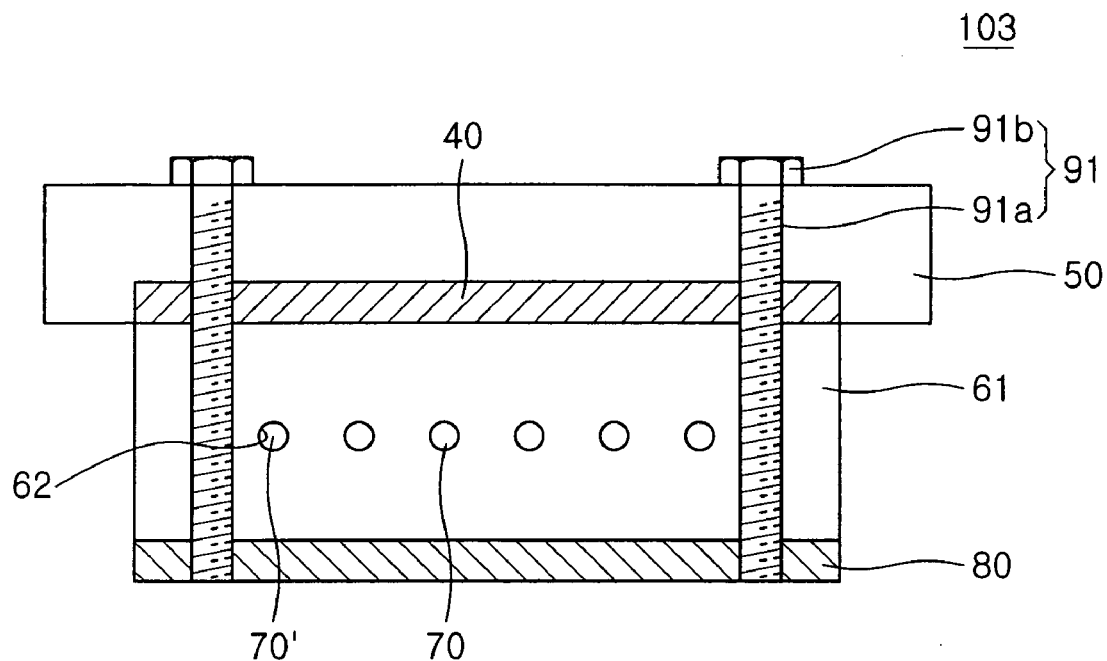
FIG. 8A is a sectional view of the probe card according to a fourth embodiment of the present invention corresponding to the sectional view taken along line a–a' of FIG. 2.
Figure 8B:
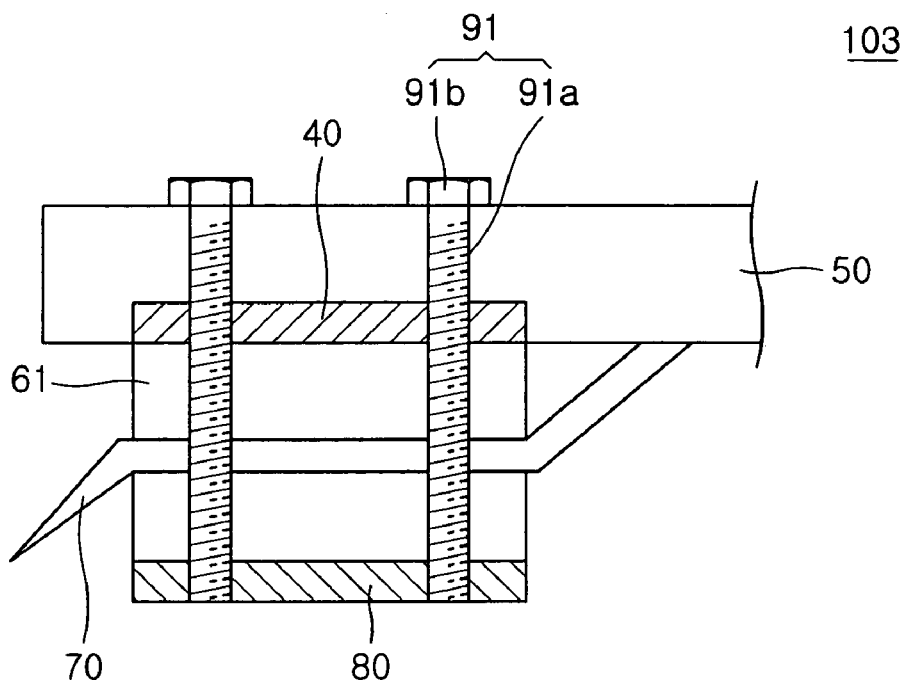
FIG. 8B is a sectional view of the probe card according to the fourth embodiment of the present invention corresponding to the sectional view taken along line b–b' of FIG. 2.

FIG. 8A is a sectional view of a probe card 103 according to a fourth embodiment of the present invention corresponding to the sectional view taken along line a–a' of FIG. 2, and FIG. 8B is a sectional view of the probe card 103 corresponding to the sectional view taken along line b–b' of FIG. 2.

The present embodiment is the same as the third embodiment except that, referring to FIGS. 8A and 8B, connecting pins 91 are composed of bolts 91a and nuts 91b, and the bolts 91a pass through a metal plate 80, a dielectric 60, and a ground electrode 40 and are threaded into the nuts 91b on a PCB 50.

Simulation

Figure 9:
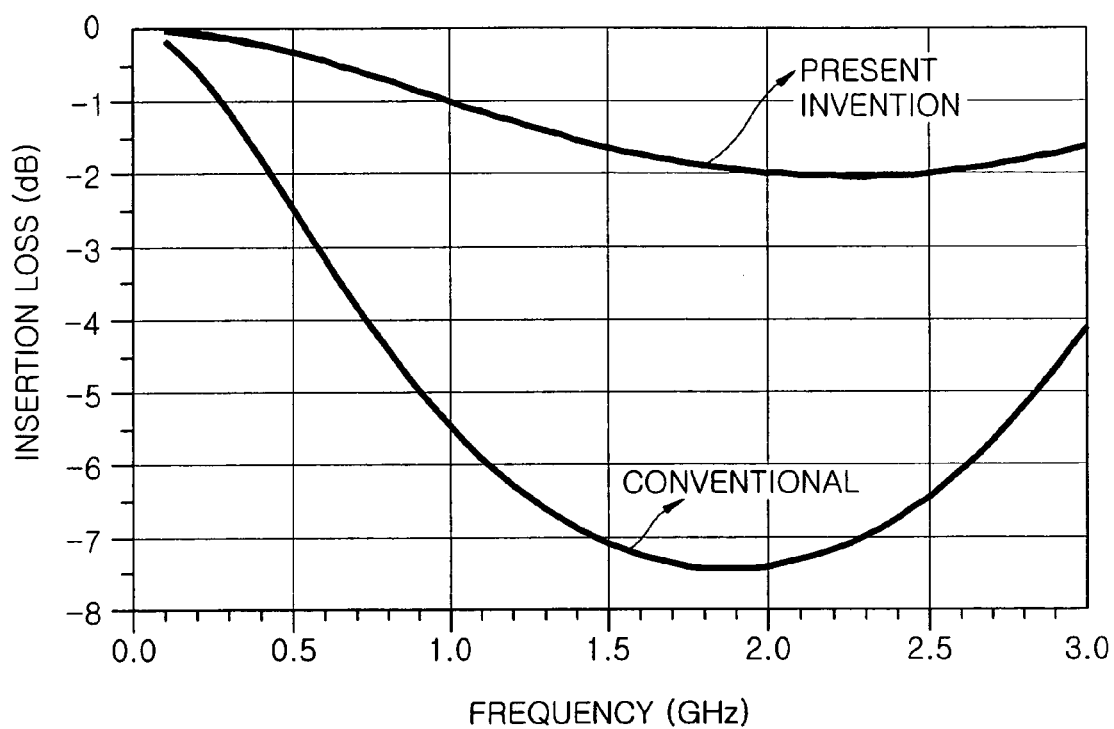
FIG. 9 is a graph of insertion loss with respect to frequency for a probe card according to an embodiment of the present invention and a conventional probe card.

FIG. 9 is a graph of insertion loss with respect to frequency for a probe card according to an embodiment of the present invention and a conventional probe card. The conventional probe card exhibits a loss of −3 dB at 500 MHz, and the probe card according to an embodiment of the present invention exhibits a loss of −2 dB at 3 GHz.

The probe card according to the present invention can be used at high frequencies due to a low insertion loss.

According to the present invention, a delay time due to signal conversion can be substantially decreased by minimizing the inductance of a needle. As a result, frequency signals in the few GHz to hundreds of GHz band can be measured. In addition, a conventional manufacturing process can be used so that the manufacturing process is simple, short, and inexpensive.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A probe card comprising:
   a printed circuit board comprising a ground electrode;
   at least one dielectric disposed below the ground electrode;
   a plurality of needles, each of the needles comprising: a first end portion contacting a wafer pad of a semiconductor device; a second end portion electrically connected to the printed circuit board; and the residual portion excepting the first and second end portions surrounded by the at least one dielectric;
   a metal plate disposed below the at least one dielectric; and
   a connecting pin electrically connecting the metal plate to the ground electrode and fixing the at least one dielectric and the metal plate to the printed circuit board.

2. The probe card of claim 1, wherein the at least one dielectric comprises an upper dielectric layer and a lower dielectric layer and the needles are disposed between the upper dielectric layer and the lower dielectric layer.

3. The probe card of claim 2, wherein the upper dielectric layer and the lower dielectric layer have the same thicknesses.

4. The probe card of claim 2, further comprising an adhesive filling spaces between the needles interposed between the upper and lower dielectric layers.

5. The probe card of claim 4, wherein spaces formed between the upper and lower dielectric layers and the needles are filled with the adhesive.

6. The probe card of claim 4, wherein the adhesive contains epoxy.

7. The probe card of claim 1, wherein the at least one dielectric is a bulky hexahedron and has through holes through which the needles are passed.

8. The probe card of claim 7, wherein the through holes pass through the center of the at least one dielectric.

9. The probe card of claim 7, wherein the through holes are parallel to the printed circuit board.

10. The probe card of claim 1, wherein the at least one dielectric is Teflon.

11. The probe card of claim 1, wherein the metal plate is composed of Cu or Al.

12. The probe card of claim 1, wherein the ground electrode, the at least one dielectric, and the metal plate have the same areas.

13. The probe card of claim 1, wherein the connecting pins are disposed at corners of the metal plate.

14. The probe card of claim 1, wherein each of the connecting pins comprises: a bolt passing through the metal plate, the at least one dielectric, and the ground electrode; and a nut into which the bolt is threaded on the printed circuit board.

15. The probe card of claim 1, wherein each of the connecting pins comprises: a bolt, which is attached to the metal plate and passes through the at least one dielectric and the ground electrode; and a nut into which the bolt is threaded on the printed circuit board.

16. The probe card of claim 1, wherein the semiconductor device is an RF device and the second end portions of the needles through which the ground and the signal are supplied to the RF device are shorter than other needles.

17. The probe card of claim 1, wherein the printed circuit board comprises an opening and four ground electrodes extending radially from the opening, and each of the ground electrodes are respectively disposed above the dielectrics and the metal plates.

18. A method of forming a probe card, the method comprising:
    passing a plurality of needles through an upper dielectric layer and a lower dielectric layer such that first end portions and second end portions of the needles protrude from the upper and lower dielectric layers, and then fixing the needles with an adhesive;
    placing a metal plate below the lower dielectric layer;
    arranging the upper dielectric layer such that the upper dielectric layer faces a ground electrode formed in a printed circuit board;
    fixing the upper and lower dielectric layers and the metal plate to the printed circuit board using connecting pins such that the metal plate is electrically connected to the ground electrode; and
    bending the first end portion to contact a wafer pad of a semiconductor device and electrically connecting the second end portion to the printed circuit board.

19. A method of forming a probe card, the method comprising:
    passing a plurality of needles through a plurality of through holes formed in a bulky hexahedral dielectric such that first end portions and second end portions of the needles protrude from the dielectric;
    placing a metal plate below the dielectric;
    arranging the dielectric such that an upper surface of the dielectric opposite the metal plate faces a ground electrode formed in a printed circuit board;
    fixing the dielectric and the metal plate to the printed circuit board using connecting pins such that the metal plate is electrically connected to the ground electrode; and
    bending the first end portion to contact a wafer pad of a semiconductor device and electrically connecting the second end portion to the printed circuit board.

20. The method of claim 19, wherein passing the needles through the through holes comprises:
    forming the bulky hexahedral dielectric;
    forming the through holes through the dielectric; and
    passing the needles through the through holes such that the first end portions and second end portions of the needles protrude from the dielectric.

* * * * *